United States Patent [19]
Byron

[11] Patent Number: 6,077,410
[45] Date of Patent: Jun. 20, 2000

[54] METHOD AND APPARATUS FOR FORMING CRYSTALS

[76] Inventor: David E. Byron, P.O. Box 796, Casselberry, Fla. 32718

[21] Appl. No.: 08/778,010

[22] Filed: Dec. 31, 1996

[51] Int. Cl.[7] .................. C25B 1/00; C25B 9/00
[52] U.S. Cl. .............. 205/91; 205/92; 205/118; 204/242
[58] Field of Search .................... 204/242, 222; 205/91, 92, 118

[56] References Cited

U.S. PATENT DOCUMENTS

| | | | |
|---|---|---|---|
| 1,452,813 | 4/1923 | Pauling | 204/242 X |
| 3,779,873 | 12/1973 | Dewar | 204/222 X |
| 5,378,337 | 1/1995 | Kiyomura | 204/242 X |
| 5,411,654 | 5/1995 | Ahern et al. | 204/242 |
| 5,605,615 | 2/1997 | Goolsby et al. | 205/83 |

Primary Examiner—Donald R. Valentine
Attorney, Agent, or Firm—Edward M. Livingston, Esq.

[57] ABSTRACT

Creating relatively pure and consistent crystals of high performance minerals, such as diamond, has long been pursued. Unfortunately, synthesizing crystals that exhibit deep bonding generally requires high temperatures and high pressures for the formation of large crystals. Alternatively, high pressure and explosive shock waves can also be utilized, as demonstrated by closed-bomb diamond synthesis. Diamond crystal formation at lower temperatures and pressures have been demonstrated, but the formations have been thin and inconsistent. A method of forming diamond and the synthesis of other high performance crystals that are consistent, and can be grown to larger sizes has not existed, nor has a means of providing uniform and consistent thin layers of diamond and other such crystals been demonstrated. The present invention solves those needs by providing a method and apparatus with which to grow uniform and consistent thin sections as well as large crystals that are deeply bonded, and to do so at lower temperatures and pressures then is currently possible, and at lower cost.

15 Claims, No Drawings

METHOD AND APPARATUS FOR FORMING CRYSTALS

FIELD OF THE INVENTION

This invention relates to the electroformation of deeply bonded crystals.

BACKGROUND

Creating relatively pure and consistent crystals of high performance minerals, such as diamond, has long been pursued. Unfortunately, synthesizing crystals that exhibit deep bonding generally requires high temperatures and high pressures for the formation of large crystals, as used in (General Electric's diamond synthesis. Alternatively, high pressure and explosive shock waves can also be utilized, as demonstrated by DuPont in their closed-bomb diamond synthesis. Diamond crystal formation at lower temperatures and pressures have been demonstrated, but the formations have been thin and inconsistent. A method of forming diamond and the synthesis of other high performance crystals that are consistent, and can be grown to larger sizes has not existed, nor has a means of providing uniform and consistent thin layers of diamond and other such crystals been demonstrated. The present invention solves those needs by providing a method and apparatus with which to grow uniform and consistent thin sections as well as large crystals that are deeply bonded, and to do so at lower temperatures and pressures then is currently possible, and at lower cost.

This invention was conceived in late 1978, and the original engineering notes were witnessed and documented at the time. In 1983 the additional research on the invention was documented by patent attorney William Hobby of Orlando, Fla., and beginning in 1986 to the present additional research and developments were documented by patent attorney Edward Livingston of Winter Park, Fla. Additional disclosures were made under secrecy agreements to Martin-Marietta employees in 1983, and to Ford and Ford Aerospace (Loral) employees in 1987/8. A disclosure document, #367706, was filed with the U.S.P.T.O.

SUMMARY OF THE INVENTION

The present invention provides a method and apparatus to create crystalline structures of a material with deep electron-orbit bonding which is cost competitive with present systems, and can repetitively create crystal structures of a desired type.

A further object of the present invention is to create said crystalline structures at relatively low temperatures and atmospheric pressures.

Another object of the instant invention is to create large, consistent crystal structures.

A further object of this invention is to provide a means to coat an existing three dimensional object with a consistent film of the deeply-bonded crystal.

Another object of the instant invention is to selectively coat an object so the crystal is formed only in the desired locations.

DESCRIPTION OF PREFERRED EMBODIMENTS

A diamond is a tetravalent crystal, as is silicon and germanium and all have analogous semi-conducting variants. Therefore, due to the copious available data, the electrical properties of diamond can be predicted, and for the most part have been verified by experimentation. Similarly, the crystal structure of "Type II," or "nitrogen-poor," electrically conductive diamonds is also well known. By the same token, the technology to create large metallic crystal formations through the process of electroforming is also well known.

What is not known, and is the subject of the instant invention, is the method and apparatus with which to create a non-metallic mineral film, such as diamond, of uniform consistency, and have the ability to grow it to a desired thickness over substrates, such as circuit boards or computer chip wafers, that will not withstand the temperatures, pressures, and environments currently used to create diamond films.

The instant invention utilizes electroforming in a closed environment wherein the gaseous or liquid electrolyte which contains carbon, or hydrocarbons, with impurities such as boron and copper, and a direct current that causes the carbon to plate out upon a cathode.

Although diamond normally has a resistivity of about $10^{70}$ Ω cm, Type II diamonds exhibit resistivity as low as 25 Ω cm, making it eminently platable. However, to become diamond, the electron shell will have two electrons in the "normal" 'K' shell of the carbon atom, and four "L-electrons" paired in overlapping orbits. To achieve this deep bonding, the carbon must be highly excited, which can be stimulated with laser excitation and microwaves, at moderate temperatures and pressures.

Since the crystal formation is similar to an electroplating process, the placement and size of the crystals can be controlled by the geometry of the electrically conductive exposed portions of the cathode, the current density and its waveform, and exposure time.

The instant invention can be utilized to form crystals of diamond (carbon), or any other deeply bonded crystal that is conductive or semi-conductive. Additionally, the instant invention can be utilized to produce crystals for jewelry, abrasives, semi-conductors (by masking the cathode), and wear-resistant surfaces when the cathode is a conductive surface to be protected.

In one embodiment, the instant invention utilizes a container of liquid electrolyte with a fixed anode and cathode so that when direct current is applied to the electrolyte, the atoms of the crystal desired are ionized and will migrate to the cathode. If the ionized atoms are excited by the application of energy, as from a laser, they will plate out on the cathode in the desired molecular configuration.

I claim:

1. A device to form deeply bonded crystals comprising:
   a means to contain an electrolyte containing atoms of a non-metal element;
   an anode and a cathode adapted for suspension in said electrolyte;
   a means to excite said atoms; and
   means to provide current to migrate said atoms to the cathode.

2. The device of claim 1 wherein the crystals formed by the device are diamond.

3. The device of claim 1 wherein the cathode has selective conductive areas.

4. The device of claim 1 wherein the cathode consists of an object to be coated with a crystal film.

5. A device to form deeply bonded crystals comprising:
   a means to contain an electrode containing atoms of a non-metal element;

an anode and a cathode adapted for exposure to said electrolyte;

a means to excite said atoms; and means to provide current to migrate said atoms to the cathode.

6. The device of claim 5 wherein the crystals formed by the device are diamond.

7. The device of claim 5 where the cathode has selective conductive areas.

8. The device of claim 5 where the cathode consists of an object to be coated with a crystal film.

9. A device to form deeply bonded crystals comprising:

a means to contain an electrolyte containing atoms of a non-metal element;

an anode and a cathode adapted for exposure to said electrolyte;

a means to selectively excite said atoms; and means to provide current to migrate said atoms to the cathode.

10. The device of claim 9 wherein the crystals formed by the device are diamond.

11. A method for forming diamond crystals comprising:

suspending an anode and cathode in an electrolyte containing atoms of a non-metal element;

exciting said atoms; and running a current through the electrolyte causing the atoms to migrate to the cathode to form the crystals.

12. The method claim of 11 wherein the atoms are excited by a laser.

13. A method for forming diamond crystals comprising:

exposing an anode and cathode to an electrolyte containing atoms of a non-metal element;

exciting said atoms; and running a current through the electrolyte causing the atoms to migrate to the cathode to form the crystals.

14. The method of claim 11 wherein the atoms are excited by a laser.

15. A method for forming diamond crystals comprising:

exposing an anode and cathode to an electrolyte containing atoms of a non-metal element;

selectively exciting said atoms; and running a current through the electrolyte causing the atoms to migrate to the cathode to form the crystals.

* * * * *